United States Patent [19]

Gaku et al.

[11] 4,287,014
[45] Sep. 1, 1981

[54] NOVEL CROSSLINKABLE RESIN COMPOSITION AND METHOD FOR PRODUCING A LAMINATE USING SAID COMPOSITION

[75] Inventors: Morio Gaku, Saitama; Norio Nagai; Yasunari Osaki, both of Tokyo, all of Japan

[73] Assignee: Mitsubishi Gas Chemical Company, Inc., Tokyo, Japan

[21] Appl. No.: 107,614

[22] Filed: Dec. 27, 1979

[30] Foreign Application Priority Data

| Dec. 27, 1978 | [JP] | Japan | 53-163332 |
| Dec. 27, 1978 | [JP] | Japan | 53-163333 |
| Dec. 27, 1978 | [JP] | Japan | 53-163334 |
| Dec. 27, 1978 | [JP] | Japan | 53-163335 |
| Dec. 28, 1978 | [JP] | Japan | 53-164298 |
| Dec. 28, 1978 | [JP] | Japan | 53-164299 |

[51] Int. Cl.$^3$ .............................................. C09J 5/06
[52] U.S. Cl. ................................. 156/306.9; 29/830; 156/182; 156/307.7; 156/330; 156/332; 156/334; 156/331.4; 174/68.5; 428/901; 525/120; 525/132; 525/177; 525/185; 528/211
[58] Field of Search ............... 156/182, 306.9, 332, 156/307.7, 334, 309.6, 330, 331; 428/901; 174/68.5; 29/829, 831, 830; 525/55, 177, 120, 185, 132; 528/211

[56] References Cited

U.S. PATENT DOCUMENTS

| 3,392,045 | 7/1968 | Holub | 525/120 |
| 3,508,330 | 4/1970 | Kubik | 174/68.5 |
| 3,535,403 | 10/1970 | Holub et al. | 525/120 |
| 3,558,423 | 1/1971 | Rossetti | 428/901 |
| 3,658,623 | 4/1972 | Gright et al. | 156/331 |
| 3,987,230 | 10/1972 | Garu et al. | 156/330 |

FOREIGN PATENT DOCUMENTS

| 1335552 | 12/1963 | France | 525/120 |
| 1060933 | 3/1967 | United Kingdom | 528/211 |

Primary Examiner—John J. Gallagher
Attorney, Agent, or Firm—Wenderoth, Lind & Ponack

[57] ABSTRACT

A crosslinkable resin composition comprising (A) a polyethylene resin composition containing 0.1 to 10% by weight of a crosslinking agent and (B) a thermosetting resin composition selected from the group consisting of cyanate ester resin compositions, polyester resin compositions and epoxy resin compositions; said crosslinkable resin composition comprising (1) 95 to 5% by weight of the resin composition (A) and 5 to 95% by weight of the resin composition (B) when the resin composition (B) is a cyanate ester resin composition, and (2) 95 to 20% by weight of the resin composition (A) and 5 to 80% by weight of the resin composition (B) when the resin composition (B) is a polyester resin composition or an epoxy resin composition; and a method for producing a laminate using said composition.

6 Claims, 6 Drawing Figures

NOVEL CROSSLINKABLE RESIN COMPOSITION AND METHOD FOR PRODUCING A LAMINATE USING SAID COMPOSITION

BACKGROUND OF THE INVENTION

This invention relates to a novel crosslinkable resin composition and a novel method for producing a laminate using said composition. More specifically, the novel resin composition of this invention has improved heat resistance, strength and adhesion while retaining the superior electrical properties of crosslinked polyethylene resin.

Crosslinked polyethylene has greatly improved heat resistance and durability over non-crosslinked polyethylene. For example, radiation-crosslinked polyethylene is used as a cable coating for submarine cables, and organic peroxide-crosslinked polyethylene is used, for example, in foamed products. Investigations are also being made to use crosslinked polyethylene commercially as a resin for printed circuit boards by utilizing its electrical properties.

As can be anticipated from its molecular structure, however, the crosslinked polyethylene has insufficient flexural strength even when it is combined with a substrate. It has a glass transition temperature, measured by the torsional vibration method, of about 50° C., and a flexural strength, at a high temperature of, say, 100° C., of as low as about 400 kg/cm². When it is used in a copper-clad laminate, the adhesion of a copper foil to it is sufficient.

According to this invention, the above disadvantages are overcome by a novel method of blending a specified thermosetting resin composition with the crosslinked polyethylene. The crosslinkable resin composition of this invention has a high glass transition temperature measured by the torsional vibration method and a good flexural strength at high temperatures, and is useful as films, molded articles, laminates, etc.

SUMMARY OF THE INVENTION

According to this invention, there is provided a crosslinkable resin composition comprising (A) a polyethylene resin composition containing 0.1 to 10% by weight of a crosslinking agent and (B) a thermosetting resin composition selected from the group consisting of cyanate ester resin compositions, polyester resin compositions and epoxy resin compositions; said crosslinkable resin composition comprising (1) 95 to 5% by weight of the resin composition (A) and 5 to 95% by weight of the resin composition (B) when the resin composition (B) is a cyanate ester resin composition, and (2) 95 to 20% by weight of the resin composition (A) and 5 to 80% by weight of the resin composition (B) when the resin composition (B) is a polyester resin composition or an epoxy resin composition.

This invention also provides a method for producing a laminate which comprises using a sheet of the foregoing crosslinkable resin composition, or a composite sheet obtained by melt-bonding the crosslinkable resin composition to a substrate, as a prepreg for lamination.

BRIEF DESCRIPTION OF THE DRAWINGS

FIGS. 3 and 4 refer to copper-clad laminates, and FIGS. 5 and 6, to multilayer printed circuit boards.

DETAILED DESCRIPTION OF THE INVENTION

Figure 1:
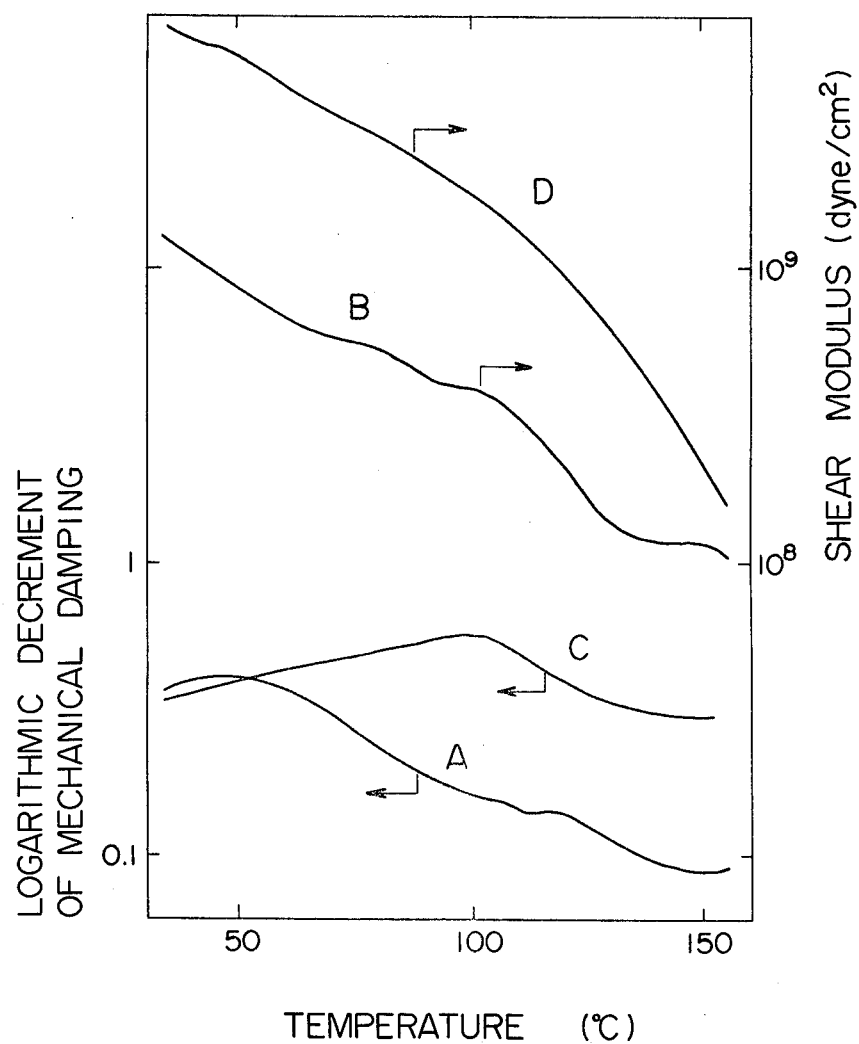
FIGS. 1 and 2 show the logarithmic decrement of mechanical damping and shear modulus in a torsional vibration method of a cured product of the crosslinkable resin composition as this invention and a crosslinked polyethylene resin.

The crosslinkable resin composition of this invention comprises a blend of the resin composition (A) and the resin composition (B). The resin composition (A) consists of polyethylene resin and 0.1 to 10% by weight, preferably 1 to 5% by weight, based on the weight of the polyethylene resin, of a crosslinking agent. The polyethylene resin denotes ordinary polyethylene resins ranging from low to high densities, and may also include copolymers composed of a major proportion of ethylene and a minor proportion of another vinyl monomer. The crosslinking agent is an organic peroxide. Preferably, more than half of the crosslinking agent remains unreacted in the composition when it is mixed with the polyethylene resin together with the resin composition (B) and other additives, or when the composition is processed into an uncured sheet, powder or pellet. Examples of the organic peroxide are t-butyl cumyl peroxide, dicumyl peroxide, α,α'-bis(t-butylperoxy)-p-diisopropylbenzene, 2,5-dimethyl-2,5-di(t-butylperoxy)hexyne-3, and 2,5-dimethyl-2,5-di(t-butylperoxy)hexene-3.

When the amount of the crosslinking agent in component (A) is less than 0.1% by weight, the degree of crosslinking is too small, and heat resistance and other properties are poor. On the other hand, even when the amount exceeds 10% by weight, no effect of further improving heat resistance, etc. can be obtained.

The resin composition as component (B) is a thermosetting resin composition selected from cyanate ester resin compositions, polyester resin compositions and epoxy resin compositions. Of these, the cyanate ester resin compositions are most preferred.

The cyanate ester resin compositions used in this invention include the following (i) to (v). These resin compositions range from liquids to solids.

(i) A polyfunctional aromatic cyanate ester monomer having the formula

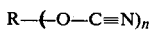

wherein n is at least 2 and not more than 5 and R is an aromatic organic group, the cyanate groups being bonded to an aromatic ring of said aromatic organic group.

(ii) A homoprepolymer of (i).

(iii) A coprepolymer of (i) and an amine.

(iv) A mixture, or a preliminary reaction product, of (i), (ii) or (iii) with an organic compound having at least one, preferably at least two, maleimide groups in the molecule.

(v) A mixture, or a preliminary reaction product, of (i), (ii) or (iii) with an epoxy resin.

The polyfunctional aromatic cyanate ester monomer (i) is a compound of the general formula

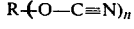 (1)

wherein R is an aromatic nucleus-containing residue which is selected from the group consisting of a residue derived from an aromatic hydrocarbon selected from the group consisting of benzene, biphenyl and naphthalene, a residue derived from a compound in which at least two benzene rings are bonded to each other by a bridging member selected from the group consisting of

wherein $R_a$ and $R_b$ are the same or different and each represents a hydrogen atom or an alkyl group containing 1 to 4 carbon atoms.

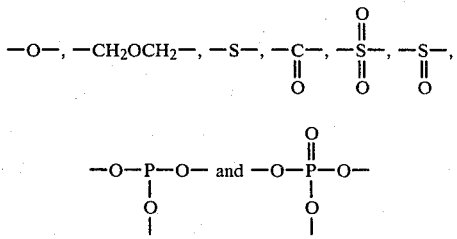

and a residue resulting from the removal of a phenolic hydroxyl group from a novolac-type or resol-type phenolic resin skeleton; said aromatic nucleus is optionally substituted by a substituent selected from the group consisting of alkyl groups containing 1 to 4 carbon atoms, alkoxy groups containing 1 to 4 carbon atoms, chlorine and bromine; n is an integer of 2 to 5, and the cyanate group is always directly bonded to the aromatic nucleus.

Examples of the polyfunctional aromatic cyanate ester monomer include dicyanatobenzene, tricyanatobenzene, dicyanatonaphthalene, tricyanatonaphthalene, 4,4'-dicyanatobiphenyl, bis(4-cyanatophenyl)methane, 2,2-bis(4-cyanatophenyl)propane, 2,2-bis(3,5-dichloro-4-cyanatophenyl)propane, 2,2-bis(3,5-O dibromo-4-cyanatophenyl)propane, bis(4-cyanatophenyl)ether, bis(4-cyanatophenyl)thioether, bis(4-cyanatophenyl)sulfone, tris(4-cyanatophenyl )phosphite, tris(4-cyanatophenyl)phosphate, and cyanate esters obtained by the reaction of novolaks with cyanogen halides. There can also be used the cyanate esters described in Japanese Patent Publications Nos. 1928/66, 4791/69, 11712/70 and 4112/71, and Japanese Laid-Open Patent Publication No. 63149/76. The aforesaid cyanate esters may be used as mixtures.

The homoprepolymer (ii) of the cyanate ester monomer is a polymer containing a triazine ring which is prepared by the trimerization of the cyanate group of the cyanic acid ester, and has an average molecular weight of at least 400 but up to 6,000 at most. Such prepolymers are known per se, and can be prepared by polymerizing the above cyanic acid esters in the presence of, as a catalyst, an acid such as mineral acids or Lewis acids, a base such as sodium hydroxide, a sodium alcoholate or a tertiary amine, a salt such as sodium carbonate or lithium chloride, or a phosphorus compound such as tributyl phosphine.

The polyfunctional cyanate ester can be used in the form of a mixture of the monomer and the prepolymer. For example, many of commercially available cyanate esters derived from bisphenol A and cyanogen halides are in the form of mixtures of cyanate monomers and prepolymers, and such materials can also be used in the present invention.

The coprepolymer (iii) of the cyanate ester monomer (i) and an amine can be used as the cyanate ester resin composition in accordance with this invention. Suitable amines that can be used to prepare the coprepolymer (iii) are polyamines of the general formula $$R^2-(NH_2)_n \qquad (2)$$

wherein $R^2$ is a polyvalent aromatic or alicyclic organic group and n is 2 to 5. Examples of the amines include phenylenediamine, xylylenediamine, cyclohexanediamine, hexahydroxylylenediamine, 4,4'-diaminobiphenyl, bis(4-aminophenyl)methane, bis(4-aminophenyl)ether, bis(4-aminophenyl)sulfone, bis(4-amino-3-methylphenyl)methane, bis(4-amino-3,5-dimethylphenyl)methane, bis(4-aminophenyl)cyclohexane, 2,2-bis(4-aminophenyl)propane, 2,2-bis(4-amino-3-methylphenyl)propane, 2,2-bis(3,5-dibromo-4-aminophenyl)propane, bis(4-aminophenyl)phenylmethane, 3,4-diaminophenyl-4'-aminophenylmethane, and 1,1-bis(4-aminophenyl)-1-phenylethane.

The coprepolymers can be produced by reacting the cyanate ester monomers with the amines, preferably using 0.1 to 1 equivalent of the diamines based on the cyanate ester monomers, in a suitable solvent such as ketones at a temperature of about 0° C. to 100° C. for 1 minute to 1 hour.

Suitable organic compounds having a maleimide group used in (iv) are represented by the following general formula

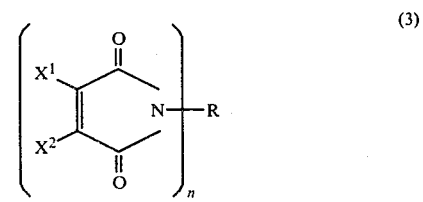

wherein R represents a divalent or trivalent aromatic or alicyclic organic group, $X^1$ and $X^2$ represent a hydrogen atom, a halogen atom or an alkyl group, and n is 2 to 5. The maleimides of the above formula can be produced by a method known per se which involves reacting a maleic anhydride with an amine having 2 to 5 amino groups to form a maleamide acid, and then dehydrocyclizing the maleamide acid. The starting amines are preferably the compounds of the above formula (2).

The epoxy resin used in (v) is a compound containing at least 1, especially at least 2, epoxy groups in the molecule. Generally, in view of the adhesion or intimate contact of the final resin products, the epoxy compounds desirably have an epoxy equivalent to 70 to 6000, especially 170 to 4000. One type of epoxy resins that can be suitably used in this invention is a bisepoxy compound of the following general formula (4)

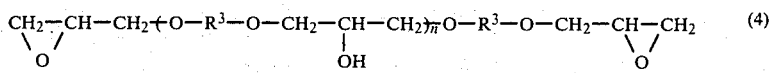

wherein n is zero or a positive number, preferably 0 to 12.

The same divalent organic groups cited hereinabove with regard to cyanate esters can be used as the divalent group $R^3$ in formula (4).

These epoxy compounds, depending upon the extent of polymerization or the type of the divalent organic group contained in the main chain, are available in a wide range of forms from relatively low viscosity liquid to relatively high melting solid, but all of such epoxy compounds can be used in the present invention.

These epoxy compounds, especially bisepoxy compounds, are prepared by reacting polyhydric phenols with epihalohydrins such as epichlorohydrin in the presence of a base such as an alkali hydroxide. Instead of reacting polyhydric phenols with epihalohydrins, the diamines described in detail hereinabove with regard to the bismaleimides may be reacted with epihalohydrin to form bisepoxy compounds. Examples of epoxy compounds readily available and suitable for the object of this invention are those derived from bisphenol A, or a chlorine- or bromine substituted derivative of bisphenol A and epihalohydrins, or epoxy compounds derived from a precondensate of phenol and formaldehyde and epihalohydrins.

A second thermosetting resin composition which can be used as component (B) in this invention is a polyester resin composition. The polyester resin composition may be obtained by reacting a carboxylic acid component such as maleic anhydride, fumaric acid, phthalic anhydride, isophthalic acid, tetrahydrophthalic acid, tetrachlorophthalic anhydride, adipic acid, mellophanic acid or trimellitic acid with a polyol component such as ethylene glycol, propylene glycol, diethylene glycol, neopentyl glycol, butanediol, glycerol or pentaerythritol, the mole ratio of the acid component to the polyol component being from 0.8 to 1.2, and if desired, incorporating a crosslinking agent such as styrene, methyl methacrylate or diallyl phthalate or a catalyst such as benzoyl peroxide, di-t-butyl peroxide or dicumyl peroxide. Useful polyester resin compositions range from liquids to solids in various molecular weights.

A third thermosetting resin composition that can be used as component (B) in this invention is an epoxy resin composition. The epoxy resin composition is defined hereinabove as one ingredient of the cyanate ester resin composition, and may include any of ordinary epoxy resins. Examples are bisphenol A-type epoxy resins, halogenated bisphenol A-type epoxy resins, phenol novolac-type epoxy resins, cresol novolac-type epoxy resins, aliphatic epoxy resins, and alicyclic epoxy resins. Useful epoxy resin compositions range from liquids to solids, and those having a melting point close to polyethylene are preferred because of their good miscibility with component (A).

The crosslinkable resin composition of this invention is obtained by blending the polyethylene resin composition (A) containing a crosslinking agent with the thermosetting resin composition (B). When the component (B) is a cyanate ester resin composition, 95 to 5% by weight of the resin composition (A) should be blended with 5 to 95% by weight of the resin composition (B). If the amount of the component (B) is less than the lower limit (5%), the improvement of heat resistance, strength, etc. is insufficient. If, on the other hand, the amount of component (B) exceeds the upper limit (95%), electrical properties are deteriorated. When component (B) is a polyester resin composition or an epoxy resin composition, 95 to 20% by weight, preferably 90 to 50% by weight, of the resin composition (A) should be blended with 5 to 80% by weight, preferably 10 to 50% by weight, of the resin composition (B). The lower limit (5% by weight) and the upper limit (80% by weight) of the amount of component (B) have been set for the same reason as described above.

A cured product of the crosslinkable resin composition of this invention is characterized by having a higher glass transition point (Tg) by the torsional vibration method and a better flexural strength (FS) at high temperatures than crosslinked polyethylene resin. Typical crosslinkable resin compositions of this invention have the following glass transition temperatures and flexural strengths.

| Crosslinkable resin composition prepared in | Component (B) | Tg (°C.) | FS (kg/cm$^2$) |
|---|---|---|---|
| Example 1 | Cyanate ester resin composition | 100 | 920 (at 100° C.) |
| Example 3 | Polyester resin composition | 90 | 630 (at 90° C.) |
| Example 5 | Epoxy resin composition | 85 | 720 (at 100° C.) |

FIG. 1 comparatively shows the results of the measurement of the viscoelasticity by the torsional vibration method of cured products of the crosslinkable resin composition of this invention containing a cyanate ester resin composition as component (B) (curves C and D) and crosslinked polyethylene resins (curves A and B). Curve A shows the logarithmic decrement of mechanical damping of the crosslinked polyethylene, and curve C shows the logarithmic decrement of mechanical damping of the resin composition of this invention. Curve B shows the shear modulus of the crosslinked polyethylene, and curve D shows the shear modulus of the resin composition of this invention. The logarithmic decrement of mechanical damping shows a dynamic decrement at free torsional vibration, and its maximum value represents the glass transition temperature of the resin. The shear modulus shows the rigidity of the resins. In FIG. 1, the maximum value of the curve A of crosslinked polyethylene resin is about 50° C., whereas the maximum of the curve C for the resin composition of this invention is about 100° C. This shows that the resin composition of this invention has a higher glass transition temperature. A comparison of curve B with curve D in FIG. 1 shows that the curable composition of this invention has a higher rigidity.

Figure 2:
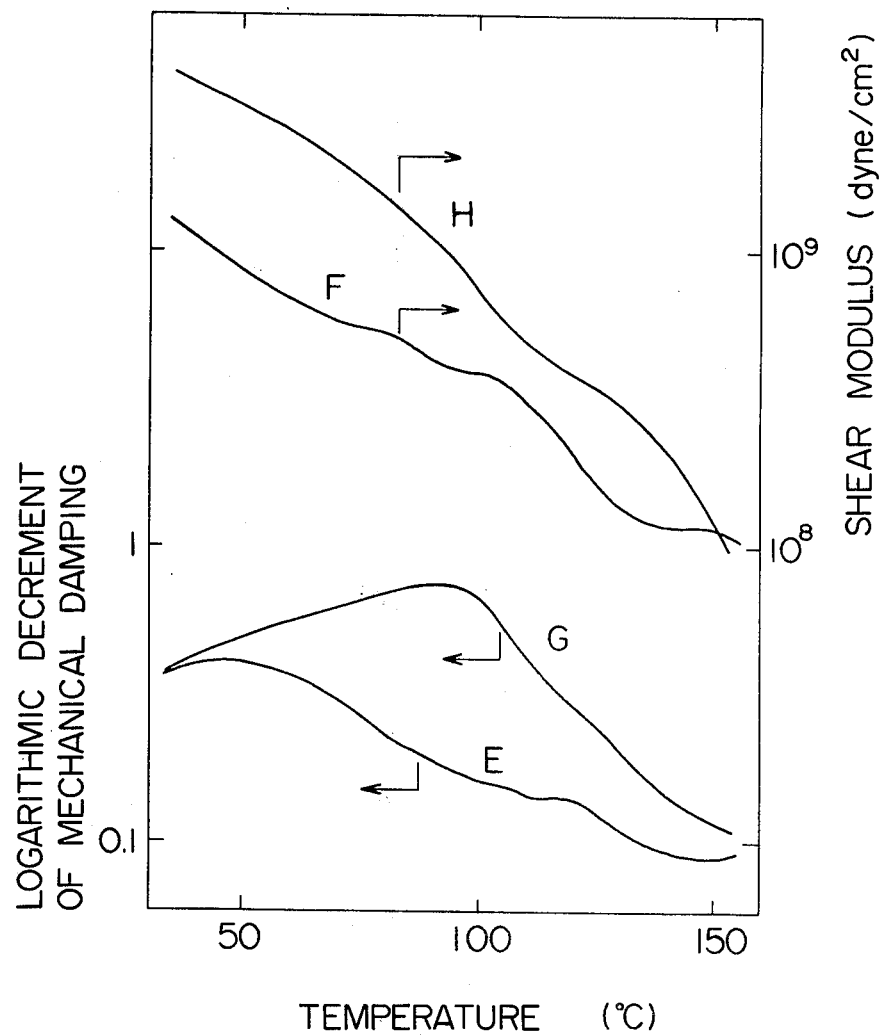

FIG. 2 shows the same comparison as in FIG. 1 with regard to a cured product of the crosslinkable resin composition of this invention containing a polyester resin composition as component (B) (curves G and H) and a crosslinked polyethylene resin (curves E and F). In FIG. 2, curve E shows the logarithmic decrement of mechanical damping of the crosslinked polyethylene, and curve G shows the logarithmic decrement of mechanical damping of the resin composition of this invention. Curve F shows the shear modulus of the crosslinked polyethylene, and curve H shows the shear modulus of the resin composition of this invention.

The crosslinkable resin composition of this invention may include, in addition to the components (A) and (B), flame retardants for effecting flame retardancy, for example halogen compounds such as decabromodiphenyl ether, brominated bisphenol A and perchloropentacyclododecane, phosphate esters such as triphenyl phosphate, tricresyl phosphate and brominated tributyl phosphate, antimony oxide, and red phosphor coated with a curable resin; stabilisers such as a copper migration preventive, a halogen absorbing agent or an antioxidant; reinforcing materials or fillers such as silica, talc, mica, aluminum oxide, titanium oxide, boron nitride and glass fibers; and dyes.

In preparing the composition of this invention, predetermined amounts of the required ingredients may be mixed simultaneously. Or it is possible to mix resinous ingredients, fillers, etc. and then mix the mixture with an organic peroxide. Usually, the mixing is effected by using a roll, kneader, mixer, extruder, etc. at a temperature from a point near the melting point of the polyethylene resin to 150° C.

The obtained crosslinkable resin composition of this invention can be preliminarily processed into such a form as an uncured powder, pellet or sheet, and may be used in a form suitable for the intended use.

Molding or curing of the crosslinkable resin composition of this invention is carried out at a temperature of 120° to 250° C., preferably 150° to 200° C., and a pressure of 5 to 200 kg/cm$^2$ for a period of 0.2 to 3 hours. If required, the cured composition may be post-cured at 200° to 250° C.

The crosslinkable resin composition of this invention described hereinabove gives molded articles of superior properties when directly molded, but it has particularly good suitability for use in the production of laminates. Laminates such as ordinary laminated plates, copper-clad laminates and multilayer printed circuit boards can be produced by using a sheet of the crosslinkable resin composition (to be referred to simply as a "sheet") or a sheet obtained by melt-bonding the crosslinkable resin composition to a base material (to be referred to as a "composite sheet"), as a prepreg for lamination. The laminates so obtained have superior electrical properties and high strength and adhesion.

The base material used in this invention is, for example, an inorganic fibrous reinforcing material such as a glass cloth surface-treated with various coupling agents such as epoxysilane, aminosilane or organic titanates or a glass paper, and a thermally stable organic fibrous reinforcing agent such as a cloth of a wholly aromatic polyamide.

Melt-bonding of the crosslinkable resin composition to the base material can be effeced, for example, by a method comprising bonding a sheet of the aforesaid resin composition and the base material by means of a hot roll, etc., a method comprising coating a melt of the aforesaid resin composition on the base material, or a method comprising applying a powder of the resin composition to the base material and then melting the powder applied. Depending upon the method of melt-bonding and arranging the consistuent materials, there can be produced composite sheets of various forms such as a homogeneous sheet, a sheet in which the base material is localized on one surface thereof, a sheet in which the base material is localized on both surfaces thereof, and a sheet in which the base material is localized in the middle portion.

The method of producing a laminate in accordance with this invention is described with reference to the accompanying drawings.

Figure 3:
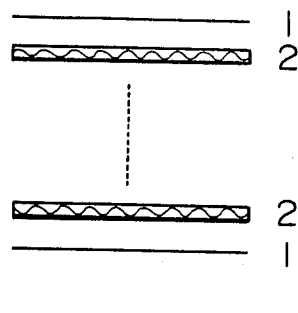
FIGS. 3 to 6 show examples of the arrangement of the laminating materials in the production of a laminate in accordance with the method of this invention.
Figure 4:
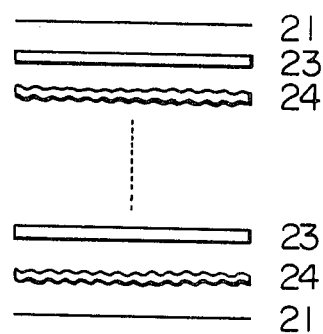

FIG. 3 shows an example of producing a copper-clad laminate by superimposing copper foils 1 on both sides of composite sheets 2 in accordance with this invention, the thickness of the laminate being freely changeable by adjusting the number of the composite sheets. FIG. 4 shows an example in which sheets 23 in accordance with this invention and base materials 24 are stacked, and copper foils 21 are superimposed on both sides of the resulting assembly. Both FIGS. 3 and 4 show examples of laminates clad with copper foils on both surfaces. Other arrangements are also possible which will produce laminates clad with a copper foil on one surface, thin laminates, and thick laminates.

Figure 5:
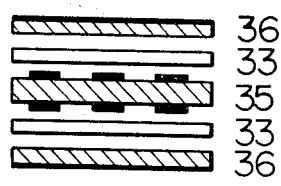
Figure 6:
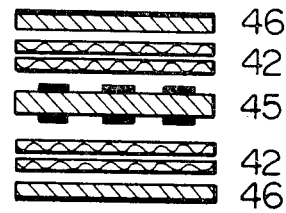

FIGS. 5 and 6 show examples in which the sheet or composite sheet in accordance with this invention is used as a prepreg for the formation of a multilayer printed circuit board. In FIG. 5, sheets 33 in accordance with this invention are superimposed on both surfaces of a material board 35 for a multilayer printed circuit board, and one surface copper-clad laminates 36 are superimposed on both surfaces of the resulting assembly. In FIG. 6, two composite sheets 42 in accordance with this invention are superimposed on each surface of material boards 45 for a multilayer printed circuit board, and laminates 46 clad with copper on one surface are superimposed on both surfaces of the entire assembly. The arrangement is not limited to those shown in these drawings, and more layers may be provided as desired.

A copper-clad laminate including a metal plate may also be produced by superimposing the sheet in accordance with this invention and a base material, or the composite sheet in accordance with this invention, on a surface-treated metal plate such as aluminum.

Pressing for the production of the aforesaid laminates may be performed at a temperature of 120° to 250° C., preferably 150° to 200° C., and a pressure of 5 to 200 kg/cm$^2$, preferably 10 to 80 kg/cm$^2$, for a period of 0.2 to 8 hours, preferably 0.5 to 3 hours. If required, the laminate may be post-cured at a temperature of about 200° to about 250° C.

A method is known for producing a laminate by using a sheet of crosslinked polyethylene resin as a prepreg. The resulting laminate, however, has a low flexural strength at high temperatures, for example about 9.4 kg/mm$^2$ at 100° C. A polyethylene resin crosslinked with an organic peroxide has insufficient adhesion to a copper foil and to other laminates. Even when it has sufficient adhesion strength, the surface of the base material revealed by etching away the copper foil thereon frequently assumes a gray to blackish gray color. Thus, such a laminate is unsuitable as an electrical material.

The method of producing laminates in accordance with this invention remedies such a defect, and can give a copperclad laminate which, for example, has a glass transition temperature, measured by the torsional vibration method, of about 100° C., a flexural strength at 100° C. of at least 20 kg/mm$^2$, and a copper foil adhesion strength of at least 1.8 kg/cm.

The following examples illustrate the present invention more specifically. All parts and percentages in these examples are by weight.

EXAMPLE 1

Ninety (90) parts of 2,2-bis(4-cyanatophenyl)propane was reacted with 10 parts of bis(4-maleimidophenyl)methane at 140° C. to form a cyanate ester resin composition having a molecular weight of 800.

Then, 56 parts of high-density polyethylene, 25 parts of perchloropentacyclododecane, 14 parts of the cyanate ester resin composition obtained as above, 5 parts of antimony trioxide and 2.0 parts of 2,5-dimethyl-2,5-di(t-butylperoxy)hexyne-3 were kneaded by a hot roll at about 130° C., and then pressed for 2 hours at a temperature of 180° C. and a pressure of 50 kg/cm$^2$. The properties of the resulting molded article are shown in Table 1.

EXAMPLE 2

Sixty (60) parts of 2,2-bis(4-cyanatophenyl)propane, 30 parts of bis(4-maleimidophenyl)methane, and 10 parts of a cresol-novolac type epoxy resin (epoxy equivalent 210–230) were reacted at 140° C. to form a cyanate ester resin composition having a molecular weight of 1,200.

Then, 35 parts of low-density polyethylene, 35 parts of the cyanate ester resin composition obtained as above, 30 parts of dicumyl peroxide and 30 parts of aminosilane-treated glass fibers were kneaded in a kneader at about 120° C., and pulverized to form a molding material.

The resulting molding material was pressed for 1 hour at a temperature of 180° C. and a pressure of 100 kg/cm$^2$. The properties of the molded article are shown in Table 1.

COMPARATIVE EXAMPLE 1

A molded article was produced in the same way as in Example 1 except that the cyanate ester resin composition was not used. The properties of the molded article are also shown in Table 1.

TABLE 1

| Property | Measuring conditions | Unit | Example 1 | Comparative Example 1 | Example 2 |
|---|---|---|---|---|---|
| Flexural strength* | 23° C. | kg/mm$^2$ | 3.11 | 2.00 | 5.40 |
|  | 60° C. |  | 1.86 | 0.86 | 5.28 |
|  | 100° C. |  | 0.92 | 0.40 | 5.05 |
| Flexural modulus* | 23° C. | kg/mm$^2$ | 77.8 | 52.0 | 181 |
|  | 60° C. |  | 44.9 | 19.5 | 176 |
|  | 100° C. |  | 16.7 | 5.8 | 164 |
| Insulation resistance* | A D-2/100 | ohms | $1 \times 10^{14}$ | $1 \times 10^{14}$ | $1 \times 10^{13}$ |
|  |  |  | $2 \times 10^{13}$ | $2 \times 10^{13}$ | $1 \times 10^{13}$ |
| Heat distortion temperature | ** | °C. | 84 | 48 | 127 |

*In accordance with JIS K6911
**In accordance with ASTM D-648

It is clearly seen from the properties shown in Table 1 that the compositions of this invention have improved heat stability and strength over the crosslinked polyethylene composition.

EXAMPLE 3

Isophthalic acid (40 parts), 23 parts of maleic anhydride and 37 parts of propylene glycol were condensed at 180° to 200° C. to afford a polyester resin having a molecular weight of 1,800.

Then, 56 parts of high-density polyethylene, 25 parts of perchloropentacyclododecane, 14 parts of the polyester resin obtained as above, 5 parts of antimony trioxide, and 2.0 parts of 2,5-dimethyl-2,5-di(t-butylperoxy)-hexyne-3 were kneaded by a hot roll at about 130° C., and pressed for 2 hours at a temperature of 180° C. and a pressure of 50 kg/cm$^2$. The properties of the molded article are shown in Table 2.

EXAMPLE 4

Tetrabromophthalic acid (46 parts), 29 parts of maleic anhydride and 25 parts of ethylene glycol were condensed at 180° to 200° to afford a polyester resin having a molecular weight of 2400.

Then, 35 parts of low-density polyethylene, 35 parts of the polyester resin obtained as above, 3.0 parts of dicumyl peroxide and 30 parts of aminosilane-treated glass fibers were kneaded in a kneader at about 120° C., and then pulverized to form a molding material.

The molding material was put into a mold and pressed for 1 hour at a temperature of 180° C. and a pressure of 100 kg/cm$^2$. The properties of the resulting molded article are shown in Table 2.

COMPARATIVE EXAMPLE 2

A molded article was obtained in the same way as in Example 3 except that the polyester resin was not used. The properties of the molded article are also shown in Table 2.

TABLE 2

| Property | Measuring conditions | Unit | Example 3 | Comparative Example 2 | Example 4 |
|---|---|---|---|---|---|
| Flexural strength* | 23° C. | kg/mm$^2$ | 2.90 | 2.00 | 4.85 |
|  | 60° C. |  | 1.42 | 0.86 | 4.70 |
|  | 100° C. |  | 0.63 | 0.40 | 4.22 |
| Flexural modulus* | 23° C. | kg/mm$^2$ | 82.6 | 52.0 | 152 |
|  | 60° C. |  | 35.0 | 19.5 | 144 |
|  | 100° C. |  | 10.5 | 5.8 | 128 |
| Insulation resistance* | A D-2/100 | ohms | $1 \times 10^{14}$ | $1 \times 10^{14}$ | $1 \times 10^{14}$ |
|  |  |  | $2 \times 10^{13}$ | $2 \times 10^{13}$ | $1 \times 10^{13}$ |
| Heat distortion temperature | ** | °C. | 71 | 48 | 118 |

*In accordance with JIS K6911
**In accordance with ASTM D-648

It is clearly seen from the properties shown in Table 2 that the compositions of this invention have improved heat stability and strength compared to the cross-linked polyethylene composition.

EXAMPLE 5

High-density polyethylene (56 parts), 25 parts of perchloropentacyclododecane, 14 parts of a phenol-novolac type epoxy resin (epoxy equivalent 175–180), 5 parts of antimony trioxide and 20 parts of 2,5-dimethyl-2,5-di(t-butylperoxy)hexyne-3 were kneaded by a hot roll at about 130° C. The kneaded composition was placed in a mold, and pressed for 2 hours at a temperature of 180° C. and a pressure of 50 kg/cm$^2$. The properties of the resulting molded article are shown in Table 3.

EXAMPLE 6

Low-density polyethylene (35 parts), 30 parts of a brominated bipshenol A-type epoxy resin (epoxy equivalent 450–500), 5 parts of diaminodiphenylmethane, 0.2 part of ethylmethylimidazole, 3.0 parts of dicumyl peroxide, and 30 parts of aminosilane-treated glass fibers were kneaded in a kneader at about 120° C., and then pulverized to form a molding material.

The molding material was placed in a mold, and pressed for 1 hour at a temperature of 180° C. and a pressure of 100 kg/cm$^2$. The properties of the resulting molded article are shown in Table 3.

COMPARATIVE EXAMPLE 3

A molded article was obtained in the same way as in Example 5 except that the epoxy resin was not used. The properties of the resulting molded articles are also shown in Table 3.

TABLE 3

| Property | Measuring conditions | Unit | Example 5 | Comparative Example 3 | Example 6 |
|---|---|---|---|---|---|
| Flexural strength* | 23° C. | kg/mm$^2$ | 2.85 | 2.00 | 4.25 |
|  | 60° C. |  | 1.48 | 0.86 | 4.11 |
|  | 100° C. |  | 0.72 | 0.40 | 3.73 |
| Flexural modulus* | 23° C. | kg/mm$^2$ | 80.1 | 52.0 | 136 |
|  | 60° C. |  | 36.2 | 19.5 | 132 |
|  | 100° C. |  | 12.0 | 5.8 | 120 |
| Insulation resistance* | A | ohms | $1 \times 10^{14}$ | $1 \times 10^{14}$ | $1 \times 10^{14}$ |
|  | D-2/100 |  | $2 \times 10^{13}$ | $2 \times 10^{13}$ | $1 \times 10^{13}$ |
| Heat distortion temperature | ** | °C. | 66 | 48 | 121 |

*In accordance with JIS K6911
**In accordance with ASTM D-648

EXAMPLE 7

Ninety (90) parts of 2,2-bis(4-cyanatophenyl)propane and 10 parts of bis(4-maleimidophenyl)methane were reacted at 140° C. to afford a cyanate ester resin composition having a molecular weight of 800.

Then, 56 parts of high-density polyethylene, 25 parts of perchloropentacyclododecane, 14 parts of the cyanate ester resin composition obtained as above, 5 parts by weight of antimony trioxide, and 2.0 parts of 2,5-dimethyl-2,5-di(t-butylperoxy)hexyne-3 were kneaded by a hot roll at about 130° C. The kneaded composition was processed into a sheet, which was then hot-bonded to a glass cloth treated with an organic titanate to form a composite sheet having a resin content of 58%.

Six such composite sheets were stacked, and a copper foil was superimposed on both surfaces of the stacked assembly. The entire assembly was pressed for 2 hours at a temperature of 180° C. and a pressure of 30 kg/cm$^2$ to produce a copper-clad laminate having a thickness of 1.6 mm. The properties of the laminate are shown in Table 4.

EXAMPLE 8

High-density polyethylene (77 parts), 8 parts of a prepolymer (molecular weight 500–550) of 2,2-bis(4-cyanatophenyl)propane, 12 parts of decabromodiphenyl ether, 3 parts of antimony trioxide, 1.0 part of 2,5-dimethyl-2,5-(t-butylperoxy)hexyne-3, and 0.2 part of zinc octylate were kneaded by a hot roll at about 130° C. The kneaded composition was processed into a sheet, which was then hot bonded to a glass cloth treated with an organic titanate to form a composite sheet having a resin content of 56%.

Six such composite sheets were stacked, and a copper foil was superimposed on both surfaces of the stacked assembly. The entire assembly was pressed for 2 hours at a temperature of 180° C. and a pressure of 30 kg/cm$^2$ to form a copper-clad laminate having a thickness of 1.6 mm. The properties of the copper-clad laminate are shown in Table 4.

EXAMPLE 9

Sixty (60) parts of 2,2-bis(4-cyanatophenyl)propane, 30 parts of bis(4-maleimidophenyl)methane, and 10 parts of a cresol-novolac type epoxy resin (epoxy equivalent 210 to 230) were reacted at 140° C. to afford a cyanate ester resin composition having a molecular weight of 1,200.

Then, 60 parts of low-density polyethylene, 40 parts of the cyanate ester resin composition obtained as above, and 5.0 parts of dicumyl peroxide were kneaded by a hot roll at about 120° C. The kneaded composition was processed into a sheet having a thickness of 0.26 mm.

Six such sheets and six epoxysilane-treated glass cloths were stacked alternately, and a copper foil was superimposed on both surfaces of the stacked assembly. The entire assembly was pressed for 2 hours at a temperature of 180° C. and a pressure of 20 kg/cm$^2$ to form a copper-clad laminate having a thickness of 1.6 mm. The properties of the laminate are shown in Table 4.

COMPARATIVE EXAMPLE 4

A laminate was produced in the same way as in Example 7 except that the cyanate ester resin composition was not used. The properties of the laminate are shown in Table 4.

TABLE 4

| Property | Measuring conditions* | Unit | Example 7 | Comparative Example 4 | Example 8 | Example 9 |
|---|---|---|---|---|---|---|
| Adhesion strength of copper foil | A | kg/cm | 2.0–2.5 | 0.3–0.5 | 2.0–2.5 | 1.8–2.2 |
|  | S$_4$ |  | 2.0–2.5 | 0.3–0.5 | 2.0–2.5 | 1.8–2.2 |
| Solder resistance | 260° C. | sec. | above 60 | above 60 | above 60 | above 60 |
| Flexural strength | 23° C. | kg/mm$^2$ | 24.7 | 12.5 | 22.4 | 29.0 |
|  | 60° C. |  | 24.3 | 11.7 | 21.9 | 28.8 |
|  | 100° C. |  | 23.6 | 9.4 | 20.1 | 28.0 |
| Flexural modulus | 23° C. | kg/mm$^2$ | 1300 | 710 | 1150 | 1850 |
|  | 60° C. |  | 1270 | 683 | 1100 | 1800 |
|  | 100° C. |  | 1180 | 502 | 983 | 1770 |
| Insulation resistance | A | ohms | $1 \times 10^{14}$ | $1 \times 10^{14}$ | $1 \times 10^{14}$ | $1 \times 10^{14}$ |
|  | D-2/100 |  | $2 \times 10^{15}$ | $2 \times 10^{13}$ | $2 \times 10^{13}$ | $1 \times 10^{13}$ |

*In accordance with JIS K6912.

It is clearly seen from the properties shown in Table 4 that the laminates in accordance with this invention have markedly improved adhesion strength, flexural strength and flexural modulus over the crosslinked polyethylene laminate.

EXAMPLE 10

Isophthalic acid (40 parts), 23 parts of maleic anhydride, and 37 parts of propylene glycol were condensed at 180° to 200° C. to afford a polyester resin having a molecular weight of 1,800.

Then, 56 parts of high-density polyethylene, 25 parts of perchloropentacyclododecane, 14 parts of the polyester resin obtained as above, 5 parts of antimony trioxide and 20 parts of 2,5-dimethyl-2,5-di(t-butylperoxy)-hexane-3 were kneaded by a hot roll at about 130° C. The kneaded composition was processed into a sheet, which was then hot bonded to a glass cloth treated with an organic titanate to afford a composite sheet having a resin content of 58%.

Six such composite sheets were stacked, and a copper foil was superimposed on both surfaces of the stacked assembly. The entire assembly was pressed for 2 hours at a temperature of 180° C. and a pressure of 30 kg/cm² to afford a copper-clad laminate having a thickness of 1.6 mm. The properties of the laminate are shown in Table 5.

EXAMPLE 11

Phthalic anhydride (26 parts), 41 parts of fumaric acid and 33 parts of ethylene glycol were condensed at 180° to 200° C. to afford a polyester resin having a molecular weight of 2,000.

Then, 77 parts of high-density polyethylene, 12 parts of decabromodiphenyl ether, 6 parts of the polyester resin obtained as above, 2 parts of a prepolymer (molecular weight 15,000) of diallyl phthalate, 3 parts of antimony trioxide and 10 parts of 2,5-dimethyl-2,5-di(t-butylperoxy)hexyne-3 were kneaded by a hot roll at about 130° C. The kneaded composition was processed into a sheet, which was then hot bonded to an organic titanate-treated glass cloth to obtain a composite sheet having a resin content of 56%.

Six such composite sheets were stacked, and a copper foil was superimposed on both surfaces of the stacked assembly. The entire assembly was pressed for 2 hours at a temperature of 180° C. and a pressure of 30 kg/cm² to afford a copper-clad laminate having a thickness of 16 mm. The properties of the laminate are shown in Table 5.

EXAMPLE 12

Tetrabromophthalic anhydride (46 parts), 29 parts of maleic anhydride and 25 parts of ethylene glycol were condensed at 180° C. to 200° C. to afford a polyester resin having a molecular weight of 2,400.

Then, 60 parts of low-density polyethylene, 40 parts of the polyester resin obtained as above and 50 parts of dicumyl peroxide were kneaded by a hot roll at about 120° C. The kneaded composition was processed into a sheet having a thickness of 0.25 mm.

Six such sheets and six epoxysilane-treated glass cloths were stacked alternately, and a copper foil was superimposed on both surfaces of the stacked assembly. The entire assembly was pressed for 2 hours at a temperature of 180° C. and a pressure of 10 kg/cm² to afford a copper-clad laminate having a thickness of 1.6 mm. The properties of the laminate are shown in Table 5.

COMPARATIVE EXAMPLE 5

A laminate was obtained in the same way as in Example 10 except that the polyester resin was not used. The properties of this laminate are shown in Table 5.

TABLE 5

| Property | Measuring conditions* | Unit | Example 10 | Comparative Example 5 | Example 11 | Example 12 |
|---|---|---|---|---|---|---|
| Adhesion strength of copper foil | A | kg/cm | 1.8–2.0 | 0.3–0.5 | 1.8–2.0 | 1.5–1.8 |
|  | $S_4$ |  | 1.8–2.0 | 0.3–0.5 | 1.8–2.0 | 1.5–1.8 |
| Solder resistance | 260° C. | sec. | above 60 | above 60 | above 60 | above 60 |
| Flexural strength | 23° C. | kg/mm² | 21.9 | 12.5 | 19.6 | 25.4 |
|  | 60° C. |  | 21.2 | 11.7 | 19.0 | 24.8 |
|  | 100° C. |  | 19.7 | 9.4 | 17.2 | 23.0 |
| Flexural modulus | 23° C. | kg/mm² | 1210 | 710 | 1090 | 1360 |
|  | 60° C. |  | 1170 | 683 | 1020 | 1320 |
|  | 100° C. |  | 1010 | 502 | 875 | 1200 |
| Insulation resistance | A | ohms | $1 \times 10^{14}$ | $1 \times 10^{14}$ | $1 \times 10^{14}$ | $1 \times 10^{14}$ |
|  | D-2/100 |  | $2 \times 10^{13}$ | $2 \times 10^{13}$ | $2 \times 10^{13}$ | $4 \times 10^{12}$ |

*In accordance with JIS K6912.

It is clearly seen from the properties shown in Table 5 that the laminates in accordance with this invention have markedly improved adhesion strength, flexural strength and flexural modulus over the cross-linked polyethylene laminate.

EXAMPLE 13

High-density polyethylene (56 parts), 25 parts of perchloropentacyclododecane, 14 parts of a phenol-novolac type epoxy resin (epoxy equivalent 175–180), 5 parts of antimony trioxide and 20 parts of 2,5-dimethyl-2,5-di(t-butylperoxy)hexyne-3 were kneaded by a hot roll at about 130° C. The kneaded composition was processed into a sheet, which was then hot bonded to a glass cloth treated with an organic titanate to afford a composite sheet having a resin content of 56%.

Six such composite sheets were stacked, and a copper foil was superimposed on both surfaces of the stacked assembly. The entire assembly was pressed for 2 hours at a temperature of 180° C. and a pressure of 30 kg/cm² to afford a copper-clad laminate having a thickness of 16 mm. The properties of the laminate are shown in Table 6.

EXAMPLE 14

High-density polyethylene (77 parts), 12 parts of decabromodiphenyl ether, 6 parts of a bisphenol A-type epoxy resin (epoxy equivalent 450 to 500), 2 parts of chlorendic anhydride, 3 parts of antimony trioxide and 1.0 part of 2,5-dimethyl-2,5-di(t-butylperoxy)hexane-3 were kneaded by a hot roll at about 130° C. The kneaded composition was processed into a sheet which was hot bonded to a glass cloth treated with an organic titanate to afford a composite sheet having a resin content of 58%.

Six such composite sheets were stacked, and a copper foil was superimposed on both surfaces of the stacked assembly. The entire assembly was pressed for 2 hours at a temperature of 180° C. and a pressure of 30 kg/cm². The properties of the laminate are shown in Table 6.

EXAMPLE 15

Low-density polyethylene (50 parts), 42 parts of a brominated bisphenol A-type epoxy resin (epoxy equivalent 450–500), 8 parts of diaminodiphenylmethane, 0.2 part of ethylmethylimidazole and 5.0 parts of dicumyl peroxide were kneaded by a hot roll at 130° C. The kneaded composition was processed into a sheet having a thickness of 0.26 mm.

Six such sheets and six epoxysilane-treated glass cloths were stacked alternately, and a copper foil was superimposed on both surfaces of the stacked assembly. The entire assembly was pressed for 2 hours at a temperature of 180° C. and a pressure of 10 kg/cm² to afford a copper-clad laminate having a thickness of 1.6 mm. The properties of the laminate are shown in Table 6.

COMPARATIVE EXAMPLE 6

A laminate was produced in the same way as in Example 13 except that the epoxy resin was not used. The properties of the laminate are shown in Table 6.

It is seen from the properties shown in Table 6 that the laminates of this invention have markedly improved adhesion strength, flexural strength and flexural modulus over the crosslinked polyethylene laminate.

What we claim is:

1. A crosslinkable resin composition comprising (A) 95 to 5% by weight of a polyethylene homopolymer resin composition containing 0.1 to 10% by weight of a crosslinking agent and (B) 5 to 95% by weight of a cyanate ester thermosetting resin composition.

2. A composition of claim 1 wherein said cyanate ester thermosetting resin composition is selected from the group consisting of
   (i) a polyfunctional aromatic cyanate ester monomer of the formula

wherein n is an integer of 2 to 5, and R is an aromatic organic group, the cyanate groups being bonded to an aromatic ring of said aromatic organic group,
   (ii) a homoprepolymer of (i),
   (iii) a coprepolymer of (i) and an amine,
   (iv) a mixture, or a preliminary reaction product, of (i), (ii) or (iii) with an organic compound having at least one maleimide group in the molecule, and
   (v) a mixture, or a preliminary reaction product, of (i), (ii), or (iii) with an epoxy resin.

3. In a method for producing a laminate which comprises consolidating a plurality of layers under heat and pressure, at least one of said layers being a prepreg sheet which is a sheet of a crosslinkable resin composition or a composite sheet obtained by bonding said sheet of said crosslinkable resin composition to a substrate, the improvement wherein said crosslinkable resin composition is a crosslinkable resin composition of claim 1.

4. A method of claim 3 which comprises stacking said sheet of said crosslinkable resin composition, a substrate and copper foil, and pressing the resultant assembly to form a copper-clad laminate.

5. A method of claim 3 which comprises stacking said composite sheet and copper foil, and pressing the resultant assembly to form a copper-clad laminate.

6. A method of claim 3 which comprises consolidating said sheet of said crosslinkable resin composition or said composite sheet, as a prepreg, and a printed circuit board material, to produce a multilayer printed circuit board.

TABLE 6

| Property | Measuring conditions* | Unit | Example 13 | Comparative example 6 | Example 14 | Example 15 |
| --- | --- | --- | --- | --- | --- | --- |
| Adhesion strength of copper foil | A | kg/cm | 1.8–2.2 | 0.3–0.5 | 1.8–2.0 | 1.5–1.8 |
|  | S4 |  | 1.8–2.2 | 0.3–0.5 | 1.8–2.0 | 1.5–1.8 |
| Solder resistance | 260° C. | sec. | above 60 | above 60 | above 60 | above 60 |
| Flexural strength | 23° C. | kg/mm² | 22.5 | 12.5 | 20.2 | 27.0 |
|  | 60° C. |  | 21.7 | 11.7 | 19.8 | 26.4 |
|  | 100° C. |  | 19.8 | 9.4 | 17.7 | 25.1 |
| Flexural modulus | 23° C. | kg/mm² | 1180 | 710 | 1010 | 1320 |
|  | 60° C. |  | 1130 | 683 | 996 | 1280 |
|  | 100° C. |  | 1050 | 502 | 894 | 1200 |
| Insulation resistance | A | ohms | $1 \times 10^{14}$ | $1 \times 10^{14}$ | $1 \times 10^{14}$ | $1 \times 10^{14}$ |
|  | D-2/111 |  | $2 \times 10^{13}$ | $2 \times 10^{13}$ | $2 \times 10^{13}$ | $2 \times 10^{13}$ |

*In accordance with JIS-K6912